March 22, 1960 G. STRULL ET AL 2,929,750
POWER TRANSISTORS AND PROCESS FOR MAKING THE SAME
Filed March 5, 1956 2 Sheets-Sheet 1

INVENTORS
Gene Strull &
John Pilipczak.
BY
Frederick Shapoe
ATTORNEY

POWER TRANSISTORS AND PROCESS FOR MAKING THE SAME

Filed March 5, 1956 2 Sheets-Sheet 2

United States Patent Office 2,929,750

Patented Mar. 22, 1960

2,929,750

POWER TRANSISTORS AND PROCESS FOR MAKING THE SAME

Gene Strull and John Pilipczak, Pittsburgh, Pa., assignors to Westinghouse Electric Corporation, East Pittsburgh, Pa., a corporation of Pennsylvania Application March 5, 1956, Serial No. 569,657

17 Claims. (Cl. 148—1.5)

This invention relates to transistors and in particular to transistors suitable for handling substantial amounts of power, and for processes for making the same.

Semiconductor materials suitable for making transistors are usually quite brittle and fragile. For many applications it is desirable to employ wafers of these semiconductor materials in thicknesses of the order of a few mils. Wafers of such thinness are difficult to manufacture, to process into transistors and to assemble the transistors into sealed containers without a high proportion of broken and defective transistors. For the highest efficiencies, high gains that are relatively uniform over a wide range of current input and output, and good amplification properties over a wide range of frequencies, it is desirable that the distances between the emitter junction and the collector junction, and the emitter and the base contact be as low as reasonably possible, yet sufficient to withstand the voltages to be applied. It will be appreciated that the physical problems of producing these various junctions so that the respective distances may be only a few mils imposes a requirement that has not been met heretofore for commercial sized operations. In fact, even in laboratory operations the utmost difficulty is faced in reducing these distances to the order of a few mils.

We have discovered novel processes for producing transistors embodying relatively thick wafers of semiconductor material of the order of from 8 to 25 mils of such a configuration that the emitter and collector junctions are spaced from 0.2 to 6 mils and the edge of the base contact is only a few mils from the edges of the emitter junction. The emitter and collector junctions are prepared by evaporation and diffusion techniques which result in transistors having a phenomenal current gain at high currents over any transistor produced heretofore. Furthermore, these transistors have remarkably uniform gain over a wide range of current inputs and outputs.

The object of the present invention is to provide a process wherein relatively thick wafers of a semiconductor material provided with depressions or grooves have the emitter junction forming materials evaporated on the bottom surfaces of said grooves while the collector junction forming materials are evaporated on the lower surface of the wafer, whereby the emitter and collector junctions are spaced apart an extremely small distance so that the semiconductor unit comprises a relatively thick reinforcing periphery around the thin-bottomed grooves.

A further object of the invention is to provide a grooved wafer of a relatively thick semiconductor single crystal with the groove walls being substantially vertical whereby the bottom of the groove may be provided with an evaporated emitter junction, the lower surface of the wafer is provided with an evaporated collector junction and the upper surface up to the edge of the walls of the groove is provided with a base contact whereby a highly satisfactory power transistor is produced.

A further object of the invention is to provide a transistor comprising a relatively large surface area single crystal of substantial thickness provided with a plurality of parallel grooves and with evaporated emitter junctions formed at the bottom of each of the grooves, an evaporated collector junction formed across the entire lower surface of the wafer and base contacts disposed along the parallel upper surfaces of the wafer along the sides of the grooves.

A still further object of the invention is to provide a transistor wherein grooved wafers of single crystal semiconductor material are provided with an evaporated emitter junction at the bottom thereof, an evaporated collector junction on the lower surface of the wafer and a base contact on the upper surface of the contact up to the edges of the grooves whereby distances of only a few mils are present between the emitter junction and the collector junction and between the edge of the base contact and the emitter junction.

Other objects of the invention will in part be obvious and will in part appear hereinafter. For a better understanding of the nature and objects of this invention, reference should be had to the following detailed description and drawing in which.

Figure 1:
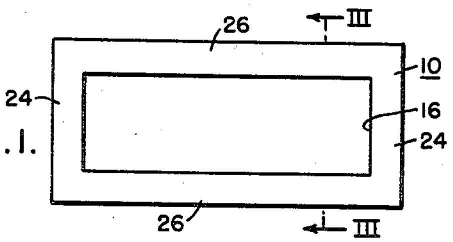
Figure 1 is a top plan view of a single crystal wafer of semiconductor material provided with a groove or depression.

In practicing the present invention wafers are prepared from single crystals having a final thickness of from 8 to 25 mils after etching, with substantially parallel upper and lower surfaces. It is customary in etching to remove from 4 to 10 mils from all surfaces so the original flat wafer must have a thickness to provide for the removal of this thickness on all surfaces. The single crystal wafers are composed of semiconductor materials that have been doped with N-type or P-type impurities. Particularly suitable materials are N-type germanium and N-type silicon which may be prepared by doping the germanium or silicon with antimony, phosphorous or arsenic. P-type doped semiconductor crystals may be prepared from germanium or silicon doped with aluminum, gallium or indium. Numerous other semiconductor materials may be employed in the practice of the invention in addition to germanium and silicon. Thus germanium-silicon alloys as disclosed in copending application Serial No. 375,416 may be employed. Semiconductor compounds of the elements of group III and group V of the periodic table may be used with good results. Examples of such intermetallic compounds are aluminum phosphide, aluminum antimonide, gallium phosphide, indium arsenide and indium antimonide. These compounds contain the group III element and the group V element in equimolar proportions. It will be understood that there are still other semiconducting materials that may be employed in practicing the present invention.

The wafers of the doped semiconducting material of any suitable size and of an initial thickness of up to 40 mils or more are provided with depressions or grooves by removing the semiconductor material from one surface thereof which will be designated herein as the upper surface. These grooves are confined entirely within the upper surface. The grooves comprise substantially flat bottom surfaces parallel to the lower surface of the wafer and, after etching, spaced from 0.2 to 6 mils from the lower surface. The walls of the groove rise substantially vertically from the entire periphery of the bottom surface to the upper surface of the single crystal wafer. Consequently, each grooved crystal comprises a relatively thick peripheral portion which provides strength and ruggedness to the entire processed single crystal. However, the bottom surface of the groove is quite close to the lower surface of the crystal.

We have been able to produce the grooves or depressions in the single crystal wafers by lapping the surface with a lapping cylinder or drum carrying an abrasive, such as aluminum oxide or diamond dust, of a fineness to pass through a screen having 400 to 600 meshes per lineal inch. The lapping operation is continued until the desired distance between the bottom of the groove and the lower surface of the single crystal has been attained. Thereafter, the wafer is etched to remove loose particles, surface irregularities and to remove any defects and mechanically disturbed regions near the surface of the crystal structure. The etching may remove a thickness of from 4 to as much as 10 mils from the wafer surfaces. After etching, the bottom of the groove is substantially flat and planar, and parallel to the lower surface of the wafer. The grooves or depressions will usually be elongated. The long side walls of the groove will rise almost vertically from the bottom of the groove. In some instances the end walls of the groove may be curved into the bottom surfaces inasmuch as cylindrical laps are employed. However, the distance from the bottom of the groove at these end portions to the nearest upper edge will only be a slight amount greater than the true vertical distance.

It will be understood that the grooves or depressions may be produced in the single crystal wafers by any other suitable means, such as etching through an apertured mask applied to the surfaces, and may assume any suitable configuration such, for example, as an annular groove or a circular depression or the like. We have found that elongated relatively straight grooves are convenient to make and to process further. It will also be understood that a plurality of grooves may be lapped simultaneously in the single crystal wafer, as will be set forth in more detail herein.

Figures 2, 3:
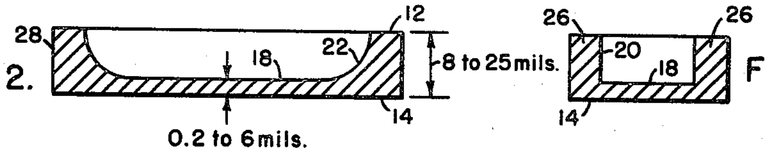
Fig. 2 is a vertical section through a single crystal wafer.
Fig. 3 is a vertical section along the line III—III of Fig. 1.

Referring to Figs. 1 to 3 of the drawing, there is illustrated a grooved single crystal wafer 10 having a flat upper surface 12 substantially parallel to the flat lower surface 14. The thickness of the etched crystal wafer, namely the distance from the upper surface 12 to the lower surface 14, will ordinarily be between about 8 and 25 mils. In practice, we have employed single crystal wafers of a thickness of from 8 to 15 mils with excellent results. In the upper surface an elongated groove 16 is present with a flat bottom surface 18 which is parallel to the lower surface 14 and spaced therefrom a distance of 0.2 to 6 mils. The groove 16 comprises sides 20 that are substantially vertical. At each end of the groove 16 rounding sides 22 extend from the ends of the bottom surface to the upper surface 12. It will be observed that the sides 22 are substantially vertical. It will be understood that the sides 20 need not be precisely vertical but may have a slight angle or slope without detrimental results. The upper surface of the crystal comprises a periphery formed by the relatively long faces 26 and short end faces 24.

In practicing the invention, it is necessary to evaporate a doping material of the opposite type of conductivity from the conductivity of the single crystal 10. Thus if the single crystal 10 comprises N-type germanium it is necessary to evaporate on the bottom surface 18 a thin layer of a P-type doping material and also to evaporate on the lower surface 14 a thin layer of the P-type doping material. The layer of the doping material to be applied to the bottom surface 18 may reach to the walls 20 and 22 but should not extend up these walls. In practice we confine the thin layer of the doping material to the flat bottom surface 18, and in fact we prefer that there be a slight uncoated margin extending around the entire periphery of the bottom surface adjacent the vertically rising walls. Such margin may be of a few mils in width. The doping layer to be evaporated on the lower surface 14 ordinarily will extend over a larger area than the layer applied on the bottom surface 18 and it should be greater than the projection of the bottom surface 18 onto the lower surface 14 so that a substantial distance exists between the periphery of the layer of doping material on the lower surface and the periphery of the projected layer on the bottom surface 18 thereon.

In order to accomplish such evaporation we place the single crystal within a masking and supporting structure which will cover and protect the upper surface 14 and the vertical outer sides 28. In addition, the mask should cover the vertical walls 20 and 22. A suitable mask may comprise two graphite plates within which the one or more entire single crystal wafers 10 may be placed. One of the graphite plates may receive the wafer and be provided with an aperture in one side thereof so that most of the lower surface 14 is exposed. A second graphite plate may be applied to cover the upper surface 12 and the sides 20 and 22. While graphite has been indicated as a suitable masking material, it will be appreciated that metals and ceramic materials of many kinds may be employed for such purpose.

Figure 4:
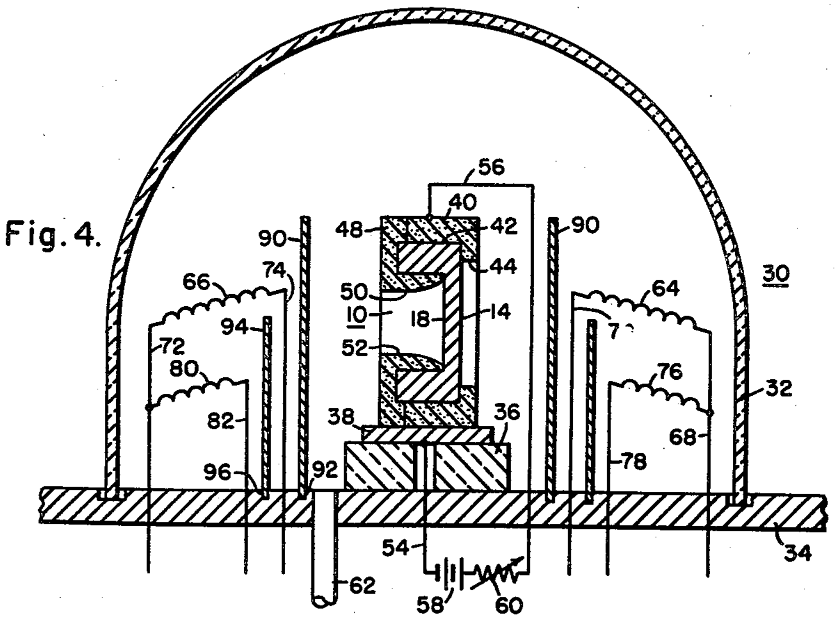
Fig. 4 is a vertical section through an evaporator employed in practicing the invention.

Referring to Fig. 4 of the drawing there is illustrated a vacuum evaporation apparatus 30 suitable for applying the layers of doping material to the bottom surface 18 and the lower surface 14 of the wafer 10. The vacuum apparatus comprises a hermetic cover 32 disposed on a base 34. The base 34 is provided with an insulated support 36 carrying an electrically conducting plate 38. On the electrically conducting plate 38 is placed the grooved single crystal wafer 10 disposed within a first graphite mask 40 having a recess 42 within which the crystal fits and having an aperture 44 through which the major portion of the lower surface 14 is exposed. In practice we have often treated several wafers at one time, thus from 2 to 5, even though only one is shown in the drawing. Cooperating with the first mask 40 to cover the wafer sides 28 is a second graphite mask 48 which fits over the upper surface 12 of the single crystal, and contains a downwardly extending projection 50 which covers the vertical walls of the groove 16. An aperture 52 in the mask 48 exposes the bottom surface 18.

An electrical conductor 54 is connected to the plate 38 while another conductor 56 is connected to the graphite masks 40 and 48. The conductors 54 and 56 are connected to a current source 58 in series with a variable resistance control 60. The operation of the variable resistance control 60 enables the flow of current to the masks 40 to be regulated so that the masks may be heated by the flow of the electrical current therethrough so as to heat the single crystal wafer 10 to any desired temperature. It will be appreciated that suitable temperature control means may be employed to indicate the temperature of the single crystal 10. We have employed a thermocouple connected to a recording thermometer for indicating the temperature of the wafer and have manually manipulated a current control such as 60 to produce the desired temperature. However, automatic programming controls may be employed for this purpose. A conduit 62 connected to a vacuum pump, to a source of gas, and the atmosphere is provided with valving to enable the evaporator apparatus 30 to be evacuated by the vacuum pump to the desired extent for evaporation purposes.

Within the cover 32 is disposed a heating filament 64 opposite the aperture 44 and a heating filament 66 opposite the aperture 52, in which filaments there is placed a piece of the doping material to be evaporated on the surfaces 14 and 18 respectively. An electrically conducting support 68 and a second electrically conducting support 70 support the filament 64 and supply electrical current thereto as required. Similarly, electrically conducting supports 72 and 74 supply electrical current to the filament 66. A piece of high purity aluminum wire, for example, may be disposed in each of the filaments or coils 64 and 66 whereby a thin layer of aluminum may be evaporated onto the unmasked portions of surfaces 14 and 18. A second filament 76 connected to a separate conducting support 78 is disposed opposite the aperture 44 for the purpose of evaporating a readily solderable metal on the surface 14, and another filament 80 supported by a separate conducting support 82 is provided for depositing a readily solderable metal on the surface 18.

The grooved wafer 10 disposed within the masks 40 and 48 is placed on plate 38 within the hermetic cover 32, with the lead 56 attached, and the space therein is evacuated through the conduit 62 to a pressure of less than 1 micron. In some instances the atmosphere may be flushed out with pure argon so that when the vacuum subsequently reaches a value of less than 1 micron there will be an extremely low partial pressure of oxygen and water vapor, both being undesirable. Good results have been obtained when the vacuum is maintained throughout the operation, within the chamber at an absolute value of $2\times10^{-4}$ mm. of mercury and less. Electrical current is passed into the masks 40 and 48 from the source 58 to heat the single crystal to a temperature above the eutectic temperature of the doping material and the semiconductor material. Thus when using aluminum as the doping material and germanium as the semiconducting material the eutectic temperature is 424° C. and the single crystal is heated to a temperature of 450 to 660° C., for example. When coating a silicon crystal with aluminum the eutectic temperature is 576° C. and the single crystal in that event is heated to a temperature of from 590° C. to 660° C. Ordinarily the temperature of the single crystal wafer preferably should be below the melting point of the doping material being deposited for the best results. However the wafer may be at a temperature above the melting point of the doping material during the evaporation and this also enables good results to be obtained. Shields 90, disposed for movement in tracks 92, are interposed between the filaments 64 and 66 and the masked single crystal wafer 10. Also shields 94 movable on tracks 96 are interposed between the filaments 76 and 80 and the wafer.

After the single crystal has been heated to a temperature above the eutectic temperature, the filaments 64 and 66 are energized to melt the doping material therein. Thus, when aluminum is the doping material the filaments are heated to a temperature of the order of 800 to 1200° C. Hereinafter aluminum will be specifically referred to. When evaporating aluminum we prefer to use tungsten, tantalum or molybdenum filaments. We find that as the temperature increases certain low temperature vaporizing impurities evaporate from the aluminum. During such evaporation the shields 90 intercept any of the low temperature vaporizing materials given off and these condense thereon since the shields 90 are relatively cold. Visual observation of the aluminum will indicate that the surface thereof becomes brighter within a few minutes of operation at, for example, 850° C. It is believed that surface oxides on the aluminum are being removed by some reaction with the tungsten, molybdenum or tantalum filament. A definite increase in the brightness of the molten aluminum is readily observed when the surface oxides are gone.

When the aluminum has become quite clean, the shields 90 are moved in the track 92 so that they are no longer interposed between the filaments 64 and 66 and the apertures 44 and 52, respectively. A coating of aluminum will evaporate from the filaments 64 and 66 through the apertures 34 and 52 on the lower surface 14 and the bottom surface 18 respectively. After a few minutes' evaporation, which is sufficient to apply a layer of the order of 0.1 to 0.01 mil of aluminum, the filaments 64 and 66 are deenergized so that the aluminum will no longer evaporate therefrom. The single crystal 10 is then held at temperature or in most cases the temperature is slightly increased but kept below the melting point of the wafer 10, for a period of time of from 1 to 30 minutes, for example, so that diffusion of the doping material into the semiconductor at the surfaces 14 and 18 will take place. The diffusing in of aluminum at the surfaces will predominate over the N-type impurity present and will convert an extremely thin surface layer of the semiconductor material to the opposite type of conductivity, namely P-type. Alloying by fusion will take place during such heat treatment. The fused and diffused aluminum will produce a junction layer having P-type conductivity at the surface 18 and at the surface 14. Consequently, a P-N-P transistor is secured.

Figure 5:
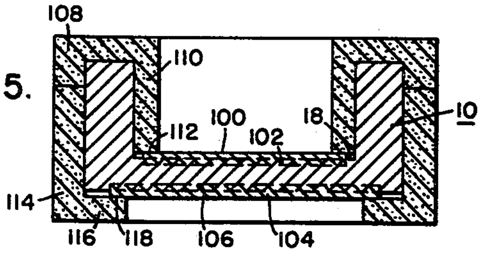
Fig. 5 is an enlarged fragmentary vertical section through a partially completed transistor.

The single crystal is removed from the masks 40 and 48 and a second pair of masks is applied to the partly processed single crystal at this time. Referring to Fig. 5 of the drawing there is shown a greatly enlarged view of the resulting single crystal device with the second pair of masks applied thereto. The single crystal 10 has deposited on the bottom surface 18 of the groove 16 a layer 100 of alloyed doping material, such as aluminum, of conductivity type opposite to the conductivity type of the main body of the single crystal. A diffused layer 102 of such opposite conductivity extends a slight distance, a small fraction of a mil, into the surface 18 and has changed the conductivity of the semiconductor material in the layer to the opposite type. On the lower surface 14 of the single crystal is disposed a thin layer 104 of the evaporated and alloyed doping material, such as aluminum, which has produced a diffusion layer 106 extending a very small distance into the lower surface of the single crystal and has converted the semiconductor material there to the opposite type. An upper mask 108 having a downwardly extending flange 110 fitting into the groove 16 so as to cover the walls 20 and 22, is placed over the upper surface of the single crystal. It will be observed that the base of the flange 110 covers a margin 112 of the previously deposited layer of aluminum 100. A lower mask 114 is applied to cooperate with mask 108 to cover the sides 28 and a portion of the bottom surface of the semiconductor crystal 10. It will be observed that the mask 114 comprises a flange 116 which covers margin 118 of the previously deposited layer 104. The margins 112 and 118 are of a width of the order of a few mils. It will be understood that these marginal distances may be from 1 to 30 mils, for example, or even more.

The single crystal with the second pair of masks 108 and 114 as shown in Fig. 5 is again heated but to a lower temperature than previously, and, while the shields 90 are in intercepting position, the filaments 64 and 66 are again energized to 800° C. to 1200° C. until the aluminum doping material therein becomes clean and free from volatile impurities. The shields 90 are then moved to a position where they no longer obstruct the evaporation upon the crystal wafer 10. Initially aluminum is evaporated upon the open areas of the wafer 10 from the filaments 64 and 66 while the wafer is at a temperature which is slightly above the eutectic temperature, then the heating of the masked element is reduced so that the temperature of the single crystal drops below the eutectic temperature. Evaporation is carried on while the temperature is dropping. It has been found that the layer of aluminum so applied is well bonded to all the previously evaporated layers. While the wafer 10 is at a temperature well below the eutectic temperature, usually around 300° C. and less for aluminum when applied to germanium, coils 76 and 80 which contain a readily solderable metal, such as silver, are also energized to evolve vapors from the readily solderable metal, upon the shields 94. After a few minutes the shields are withdrawn and for a brief period of time a joint evaporated deposit of aluminum and silver is applied to the areas of the single crystal exposed through the masks 108 and 114. This joint evaporated deposit comprises a transition layer. It need not be very thick. Thus, we have found joint evaporation for about 30 seconds is adequate to produce a satisfactory transition layer which is well bonded to the underlying aluminum layers. At this time the evaporation of aluminum may be terminated by interrupting flow of current to the coils 64 and 66. A layer of substantially pure readily solderable metal is then evaporated over the transition layer and it will be well bonded thereto. A sufficient thickness of the readily solderable metal, such as silver, is applied to enable terminals to be soldered thereto. Ordinarily about one mil thickness of silver is adequate.

The entire evaporation process is then concluded, the wafer cooled, vacuum broken, and the wafer 10 removed and the masks 108 and 114 taken off. There is then applied to the single crystal a base contact on the upper surface 12 up to the edges of the vertical walls 20 and 22. For example, the entire upper surface 14 may be coated with suitable solder such as tin or tin containing N-type doping impurities only. The base contact may comprise a preformed member of a good conducting metal such as molybdenum, or an alloy, whose surfaces have been tinned and such member may be then soldered to the surfaces 12.

Figure 6:
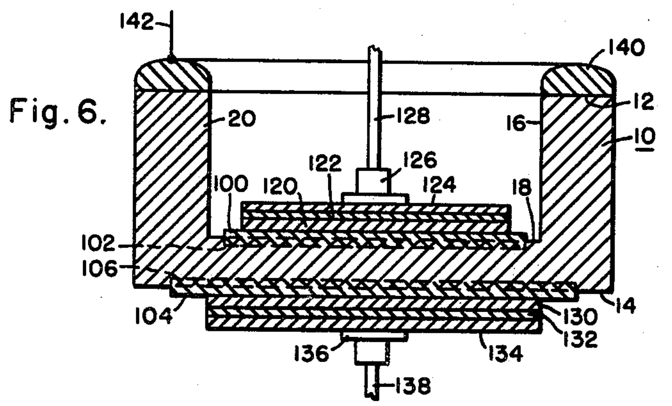
Fig. 6 is an enlarged vertical cross section through a completed transistor.

Referring to Fig. 6 of the drawing there is illustrated a complete transistor, including soldered terminals applied thereto, produced in accordance with the invention. The transistor comprises the single crystal wafer 10 of germanium, for instance, containing N-type doping impurities. On the bottom surface 18 of groove 16 is present a layer 100 of aluminum alloyed with germanium and a diffusion P-type layer 102 which layers 100 and 102 function as the emitter junction. A smaller evaporated layer 120 of aluminum is disposed over the layer 100, a transition layer 122 comprising aluminum and the readily solderable metal, such as silver is applied on layer 120. A final layer 124 of the evaporated silver, or other readily solderable metal, is disposed over the transition layer 122. A terminal 126 to which is affixed an emitter conductor lead 128 is soldered to the layer 124. On the lower surface 14 is the collector junction which comprises a layer 104, such as aluminum alloyed with germanium, and the diffused layer 106 of P-type conductivity. A layer of evaporated aluminum 130 is superimposed on the layer 104 followed by a transition layer 132 of aluminum and silver, for example. Finally, a layer 134 comprising all silver is evaporated upon the top of the transition layer. A terminal 136 soldered to the silver layer 134 carries a collector lead 138. It will be observed that the layer 104 is of greater extent than the superimposed layer 100. It is vital for the optimum operation of the transistor that the layer 104 and 106 be of such extent and so disposed that the projection of the layer 100 and 102 thereon will be contained entirely within the layer 104 and 106 with a substantial margin between the respective peripheries. Such margin should be of the order of at least 10 mils for most purposes. On the upper surface 12 there is placed a base contact 140 comprising solder, such as tin, which extends to the edge of the vertical wall 20 of the groove 16. A current lead 142 is soldered to the contact 140.

While a conventional terminal 136 is shown as being attached to the collector junction layer 134, it will be appreciated that in most cases the layer 134 will be soldered to a heat absorbing, electrically conducting support. Thus the layer 134 may be soldered to a silvered tungsten or molybdenum slab and the entire transistor embedded in a hermetically sealed casing with the tungsten or molybdenum slab soldered to the casing wall and thence to a heat radiator.

It will be observed that the distance between the emitter and collector layers 102 and 106 is less than 6 mils and ordinarily will be only a mil or two, and frequently even less. Furthermore, these evaporated and diffused layers 102 and 106 are uniform depth and substantially equidistant at all points. Also, the linear distance from the edge of the base contact 140 at the vertical wall 20 of the edge of the emitter junction layer 102 is of the order of a few mils. We have usually produced these latter within a distance of 5 to 6 mils with no difficulty whatever. There is no danger of the base contact material 140 coming in contact with or short-circuiting with the emitter junction 102. This slight distance of the order of a few mils is not practical or feasible with transistor structures wherein the base and the emitter are located on the same plane surface.

While silver has been specifically referred to as a readily solderable metal, tin, zinc and lead, or alloys of any two or more may be employed with equally good results.

By reason of the spatial arrangement and configuration of the transistor such as shown in Fig. 6, cooperating with the evaporated alloyed and diffused emitter and collector junctions, we have produced transistors suitable for large power applications, which transistors have outstanding characteristics. In a number of instances we have obtained common emitter current gains of the order of 1000 with germanium transistors, or a power gain of 30, at currents where the best available transistors had current gains of the order of 4 to 20. Previously known transistors had the undesirable characteristic of a rapid fall-off in current gain with increase of current. Our devices have exhibited no significant fall-off in gain with increase in power until that point is reached at which the heat begins to effect the operation of the device. In one case one of our transistors had a current gain of approximately 50 both at 100 milliamperes and at 5 amperes. Ordinarily the gain varies less than 20% over a 10 to 1 current change.

It will be understood that the present invention may be applied to relatively large wafers of semiconductor single crystals wherein a plurality of grooves or depressions may be made. We have discovered that in making the transistors it is desirable the bottom surfaces of the grooves have a width of not substantially in excess of 150 mils and that the thickness of the single crystal wall between successive grooves be at least 10 mils. Where a plurality of grooves are to be produced, it is ordinarily preferable that the several grooves be of parallel elongated configuration.

Figure 7:
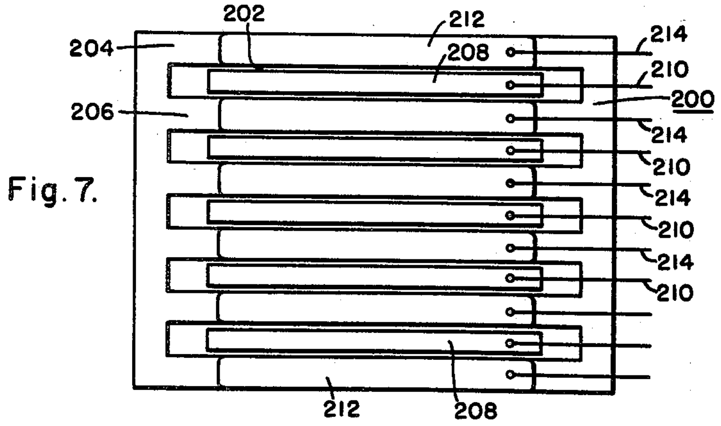
Fig. 7 is a top plan view of a multigrooved transistor.
Figure 8:
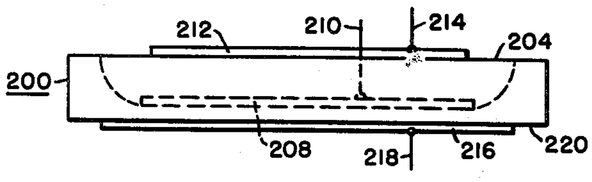
Fig. 8 is a side elevation of the transistor of Fig. 7.

Such a multigroove transistor construction is illustrated in Figs. 7 and 8 of the drawing wherein the multigrooved transistor 200 comprises a semiconductor single crystal in which there are produced 5 parallel elongated grooves 202. A relatively thick width 204 of the single crystal material is present between the outermost grooves and the side of the single crystal. Somewhat thinner strips 206 of the single crystal material may be present between successive grooves. Evaporated on the flat bottom surface of each groove is an emitter junction layer 208 corresponding to the several layers forming the emitter contact and junction of Fig. 6. A lead 210 is connected to each of the emitter junctions 208. Similarly, a base junction 212 is applied to the linearly extending upper surfaces 204 and 206. It will be noted that the contact junctions 212 do not extend beyond a vertical plane through the ends of the emitter junctions 208. Each of the base junctions 212 is provided with a lead 214. The leads 210 from each of the respective junctions 208 may be connected as a common lead or they may be energized separated as required. Similarly, the base leads 214 may be connected together or else energized separately. A collector junction 216 having a current lead 218 is applied to the surface 220 of the wafer 200. The collector junction 216 is prepared similarly to and compares in structural relationship to the collector junction layers shown in Fig. 6.

The following examples are illustrative of the practice of the invention:

*Example I*

A single crystal wafer of germanium doped with antimony to render it N-type was prepared with parallel upper and lower surfaces. The wafer was of an initial thickness approximately 24 mils, ⅞ inch in length and ¼ inch in width. A groove of a width of $\frac{3}{32}$ of an inch and of a total length of ¾ inch was lapped into the upper surface of the wafer.

The lapped wafer was etched for 1 minute in a solution comprising 250 ml. concentrated nitric acid (70%), 150 ml. concentrated acetic acid, 150 ml. of 48% hydrofluoric acid and 5 ml. of bromine. Approximately 6 mils was removed from all surfaces. The etched wafer had a thickness of 12 mils. The flat bottom surface of the groove after etching was spaced approximately 2 mils from the lower surface of the wafer.

After the wafer was masked it was put into a vacuum evaporator as shown in Fig. 4. Aluminum was evaporated upon the flat bottom surface of the groove simultaneously with the application of a layer of evaporated aluminum on the lower surface of the wafer. The temperature of the wafer was approximately 480° C. and the thickness of the evaporated layers was less than 0.1 mil. These layers were then fused at a temperature of 600° C. for a few minutes in order to produce emitter and collector junctions of P-type conductivity within the bottom surface of the groove and on the lower surface of the wafer. The collector junction on the lower surface of the wafer was substantially larger in area than the emitter junction within the groove. The layers were then masked to cover their margins, the temperature of the wafer was lowered to approximately 460° C., and additional aluminum was evaporated within a smaller area in each instance than the previously evaporated aluminum area. Approximately 5 mils' separation between the two peripheries was present. After additional aluminum was evaporated on these reduced area layers, the temperature of the single crystal wafer was reduced to approximately 300° C. in a few minutes with the aluminum being evaporated continuously. The total thickness of the aluminum layers was approximately 1 mil. Then silver was evaporated simultaneously with the aluminum for 30 seconds while the wafer's temperature was at approximately 300° C. The evaporation of the aluminum was then discontinued and silver alone was evaporated to a thickness of approximately 1 mil. The wafer was cooled and removed from the evaporation apparatus. A layer of tin was applied to the upper faces of the crystal up to the edges of the groove to provide a base contact. Thereafter, terminals and leads were applied to the emitter junction layer within the groove, the collector junction layer on the lower surface of the crystal, and to the base contact on the upper surface. On tests this transistor exhibited common emitter current gains of 300 and higher while handling currents of from 100 milliamps, to 10 amperes. The variation in gain was less than 20% throughout the entire range of operation.

*Example II*

A wafer of N-type silicon of dimensions ¼ inch by ½ inch was lapped to provide a groove therein ⅜ inch long. After etching the wafer was 10 mils thick, and the bottom of the groove was approximately 0.5 mil from the lower surface of the wafer. The bottom surface of the groove and the lower surface of the silicon crystal were both coated with evaporated layers of aluminum following the previous example except that the silicon was heated to a temperature of between 600 and 660° C. during the application of the first layers and at a lower temperature after remasking and the second smaller layers of aluminum were evaporated. The superimposed transition layer was applied at a temperature of 300° C. The transition layer comprised silver and aluminum. Silver was applied as the solderable metal on both the emitter and collector junctions. While under vacuum, a molybdenum base coated with silver-antimony (2%) was fused to the upper surface of the silicon crystal to provide the base contact. The resulting transistor was tested over a range of currents of up to 2 amperes. The common emitter gain of the transistor was 4. The gain was relatively constant for currents of from 10 milliamps. to 100 milliamperes. A common emitter current gain of 4 for silicon is quite acceptable.

*Example III*

A germanium crystal of dimensions ¾ inch by ¾ inch was provided with 5 lapped grooves therein each $\frac{1}{16}$ inch wide and ⅝ inch in length. The outermost of the resulting parallel strips of the upper surface were $\frac{3}{32}$ inch wide while the thickness of the single crystal between adjacent grooves was $\frac{5}{16}$ inch. After etching the wafer was 12 mils thick and the grooves were 4 mils above the lower surface. The grooves were masked and coated with aluminum and silver following the procedure set forth in Example I. The emitter junction area in each groove was approximately ½ inch long and 50 mils wide. Similarly, a collector junction was provided on the back of the crystal covering an area within $\frac{1}{16}$ inch of the outside periphery of the wafer. On each of the longitudinal upper surface portions paralleling each groove there was deposited a tin solder for a base junction contact. All of the leads from the 5 grooves were connected together and the 6 base connection leads were connected together. The multigrooved transistor so prepared exhibited gains of over 100 and is large enough to control currents of up to 50 amperes. There was very little change in gain with increase in output current from a few milliamps up to 10 amperes and higher.

Figure 9:
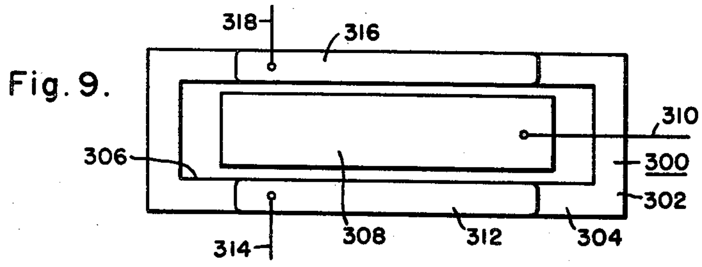
Fig. 9 is a top plan view of a tetrode.

The grooved semiconductor devices may be prepared to be employed as tetrodes as well as transistors. Such a construction is illustrated in Fig. 9, wherein the tetrode device 300 is shown. The tetrode comprises a wafer 302 having an upper surface 304 in which is present a groove 306 having an emitter junction layer 308 applied to its bottom surface, with a current lead 310 attached thereto. On the upper surface 304, there is soldered a first base contact 312 and a second base contact 316 on the ledges parallel to the side of the groove 306, the contacts being well within the vertical planes at each end of the emitter layer 308. Leads 314 and 318 are soldered to the base contacts 312 and 316 respectively. The collector junction is disposed on the bottom of the wafer 302. The leads 314 and 318 can be energized separately, or they can be joined and energized as a single base contact, whereby the device 300 functions as a transistor.

It will be understood that for the ordinary transistor applications, the collector junction is of larger area than the emitter junction in order to secure the maximum gain in one direction. However, for certain applications it is desirable to have available a symmetrical transistor usable with normal and inverse connections with a gain independent of which junction is used as an emitter. We have produced transistors wherein the junction evaporated on the bottom of the groove was the same size or larger than the evaporated junction on the lower surface of the transistor wafer. One germanium transistor so made had a gain of 96 at 1 ampere current when the junction in the groove was the emitter, and a gain of 78 at 1 ampere when the junction in the groove was employed at the collector.

It will be understood that the above description and drawing are illustrative and not limiting.

We claim as our invention:

1. In the process of producing a semiconductor device the steps comprising preparing a flat single crystal wafer having substantially parallel upper and lower surfaces, the single crystal wafer composed of a solid N-type semiconductor material, removing from the upper surface a portion of the wafer to provide a depression having a flat bottom surface substantially parallel to the lower surface of the wafer, and having substantially vertical walls rising from the entire periphery of the bottom surface to the upper surface, etching the wafer, the etched wafer having a thickness of from 8 to 25 mils and the bottom surface being spaced 0.2 to 6 mils from the lower surface, vacuum evaporating a thin layer of a P-type doping material on (*a*) only the flat bottom surface of the depression and (*b*) on an area of the bottom surface which is directly below the bottom of the depression, the wafer being at a temperature above the eutectic temperature of the semiconductor material and the doping material but below the melting temperature of semiconductor material, heating the applied thin layer of doping material and the wafer to alloy and diffuse the doping material into the semiconductor material to produce a thin P-type junction layer in the underlying surface of the semiconductor material, thereby producing a P–N–P device, cooling the wafer from the first temperature to a temperature above eutectic temperature, evaporating an additional layer of the doping material on both of the previously evaporated layers, cooling the wafer to a temperature below said eutectic temperature and continuing evaporation of the doping material during the last cooling, evaporating concurrently therewith a readily solderable metal when below the eutectic temperature on each of said layers, the evaporation of the additional layer and the subsequent layers all being on an area whose periphery is spaced at all points a substantial distance from the periphery of the underlying evaporated layer, the concurrent evaporation providing a well bonded transition layer of both the solderable metal and the doping material, then evaporating a layer of only the readily solderable metal on the transition layer to enable the soldering of electrical conductors thereto, and applying a base contact to the upper surface up to the edge of the vertical walls of the depression, the edge of the base contact being spaced only a few mils from the edge of the P-type junction layer in the depression.

2. The process of claim 1 wherein the single crystal is composed of P-type semiconductor material, and the layers of evaporated material comprising N-type doping material so as to produce an N–P–N device.

3. The process of claim 1 wherein the semiconductor material is removed to form a depression in the shape of an elongated groove of a width of not in excess of 150 mils.

4. In the process of producing a transistor, the steps comprising preparing a flat single crystal wafer having substantially parallel upper and lower surfaces, the single crystal composed of a solid N-type semiconductor material selected from the group consisting of silicon and germanium, removing from the upper surface a portion of the wafer to provide a depression having a flat bottom surface substantially parallel to the lower surface of the crystal and having substantially vertical walls rising from the entire periphery of the bottom surface to the upper surface, etching the crystal wafer, the etched wafer having a thickness of from 8 to 25 mils and the bottom surface spaced from 0.2 to 6 mils from the lower surface, vacuum evaporating a thin layer of the order of 0.01 to 0.1 mil of aluminum on (*a*) only the flat bottom surface of the depression and (*b*) on an area of the bottom surface which is larger than and which includes the projected bottom of the depression with a substantial margin therebeyond, the wafer being at a temperature above eutectic temperature but below the melting point of semiconductor material alone, heating the applied thin layer of aluminum and the single crystal to alloy and diffuse the aluminum into the semiconductor material to produce a thin P-type junction layer in the underlying surface of the semiconductor material, thereby producing a P–N–P device, cooling the wafer from the first temperature to a temperature above the eutectic temperature, evaporating an additional layer of aluminum on each of the previously evaporated layers, cooling the wafer to a temperature below the eutectic temperature while continuing evaporating additional aluminum on each of the layers, then when so cooled simultaneously evaporating with the aluminum a readily solderable metal on each of the layers, the evaporation of the additional layer of aluminum and all subsequent layers being applied on an area whose periphery is removed at all points from the periphery of the underlying aluminum layer, the simultaneous evaporation providing a well bonded joint transition layer, then evaporating only the readily solderable metal on the transition layer to enable the soldering of electrical conductors thereto, and applying a base contact to the upper surface up to the edge of the vertical walls of the depression, the base contact being only a few mils removed from the edge of the P-type junction layer in the depression.

5. The process of claim 4, wherein the readily solderable metal is silver.

6. The process of claim 4, wherein the base contact comprises a solder comprising materials which will not change the N-type conductivity of the semiconductor material with which it is in contact.

7. The process of claim 4 wherein the removal of the semiconductor material is carried out by lapping and etching.

8. In the process of preparing a power transistor from a flat single crystal wafer of a solid N-type semiconductor material, the crystal having substantially parallel upper and lower surfaces, the steps comprising removing from the upper surface a portion of the wafer to provide a depression having a flat bottom surface substantially parallel to the lower surface of the wafer, and having substantially vertical walls rising from the entire periphery of the bottom surface to the upper surface, etching the wafer to provide a wafer thickness of from 8 to 25 mils and the flat bottom surface being from 0.2 to 6 mils from the lower surface, vacuum evaporating a thin layer of a P-type doping material on (*a*) only the flat bottom surface of the depression and (*b*) on an area of the bottom surface which is larger than and would include the projected superposed bottom of the depression with a substantial margin therebeyond, the wafer being at a temperature above the eutectic temperature of the semiconductor material and the doping material but below the melting temperature of semiconductor material, heating the applied thin layer of doping material and the wafer to alloy and diffuse the doping material into the semiconductor material to produce a thin P-type junction layer in the underlying surface of the semiconductor material, thereby producing a P–N–P transistor cooling the single crystal to a temperature below the first temperature and above eutectic temperature, evaporating an additional layer of the doping material on both of the previously evaporated layers, cooling the wafer to a temperature below said eutectic temperature while evaporating the doping material during the cooling, then when so cooled, simultaneously evaporating a readily solderable metal on each of said layers, the additional layer and all subsequent layers being applied on an area whose periphery is spaced at all points a substantial distance from the periphery of the underlying first evaporated layer, the simultaneous evaporation providing a well bonded transition layer of both the solderable metal and the doping material, then evaporating a layer of only the readily solderable metal on the transition layer to enable the soldering of electrical conductors thereto, and applying a base contact to the upper surface up to the edge of the vertical walls of the depression, the edge of the base contact being spaced only a few mils from the edge of the P-type layer in the depression.

9. In the process of preparing a power transistor from a flat single crystal wafer of a solid N-type semiconductor material, the crystal having substantially parallel upper and lower surfaces, the steps comprising removing from the upper surface of the wafer a plurality of parallel portions to produce a series of parallel grooves each of a width of not in excess of 150 mils, each groove having a flat bottom surface substantially parallel to the lower surface of the crystal and having substantially vertical walls rising from the periphery to the upper surface, etching the wafer to provide a wafer thickness of from 8 to 25 mils, the bottom surface of the grooves being spaced 0.2 to 6 mils from the lower surface and the thickness of the semiconductor wall between each groove being at least 10 mils, vacuum evaporating a thin layer of P-type material on (*a*) only the bottom surface of each groove and (*b*) on the lower surface of the wafer over an area which includes all of the superposed groove bottoms with the periphery extending substantially beyond the projections of all the grooves on the lower surface, the crystal being at a temperature above the eutectic temperature of the semiconductor material and the doping material but below the melting temperature of either material alone, heating the applied thin layer of doping material and the wafer to alloy and diffuse the doping material into the semiconductor material to produce a thin P-type junction layer in the underlying surface of the semiconductor material, thereby producing a P–N–P transistor cooling the single crystal to a temperature below the first temperature and above eutectic temperature, evaporating an additional layer of the doping material on all of the previously evaporated layers, cooling the single crystal to a temperature below said eutectic temperature while continuing evaporation of the doping material, then when so cooled simultaneously evaporating a readily solderable metal on each of said layers, the additional layer and all subsequent layers being applied on an area whose periphery is spaced at all points a substantial distance from the periphery of the underlying evaporated layer, the simultaneous evaporation providing a well bonded transition layer of both the solderable metal and the doping material, then evaporating a layer of only the readily solderable metal on the transition layer to enable the soldering of electrical conductors thereto, and applying a base contact to the upper surface up to the edge of the vertical walls of the groove, the edge of the base contact being spaced only a few mils from the edge of the P-type layer in the groove.

10. In the process of preparing a power transistor from a flat single crystal wafer of a solid N-type semiconductor material, the crystal wafer having substantially parallel upper and lower surfaces, the steps comprising removing from the upper surface a portion of the crystal to provide a depression having a flat bottom surface substantially parallel to the lower surface of the crystal, and having substantially vertical walls rising from the entire periphery of the bottom surface to the upper surface, etching the wafer to provide a wafer thickness of from 8 to 25 mils and the bottom surface being spaced 0.2 to 6 mils from the lower surface, applying a mask to cover the upper surface and side walls of the wafer and the vertical walls of the depression, vacuum evaporating a thin layer of a P-type doping material on (*a*) only the flat bottom surface of the depression and (*b*) on an area of the bottom surface which is larger than and includes the projected bottom of the depression thereon with a substantial margin therebeyond, the wafer being at a temperature above the eutectic temperature of the semiconductor material and the doping material but below the melting temperature of semiconductor material, heating the applied thin layer of doping material and the wafer to alloy and diffuse the doping material into the semiconductor material to produce a thin P-type junction layer in the underlying surface of the semiconductor material, thereby producing a P–N–P transistor, cooling the single crystal to a temperature above eutectic temperature, then applying to both evaporated areas a mask covering the surfaces and exposing smaller areas contained well within each of the previously evaporated layers, evaporating an additional layer of doping material on both of the previously evaporated layers, cooling the single crystal to a temperature below said eutectic temperature while continuously evaporating the doping material, when the wafer is so cooled simultaneously evaporating a readily solderable metal on each of said layers, the simultaneous evaporation providing a well bonded transition layer of both the solderable metal and the doping material, then evaporating a layer of only the readily solderable metal on the transition layer to enable the soldering of electrical conductors thereto, and applying a base contact to the upper surface up to the edge of the vertical walls of the depression, the edge of the base contact being spaced only a few mils from the edge of the P-type layer in the depression.

11. A transistor comprising a flat single crystal wafer of a solid N-type semiconductor, the wafer being of a thickness of from 8 to 25 mils and having flat parallel upper and lower surfaces, the wafer having a depression with a flat bottom surface disposed in the upper surface, the walls of the depression rising substantially vertically from the flat bottom to the upper surface, thereby providing a relatively thick periphery entirely surrounding the depression, the distance from the bottom surface of the depression to the lower surface being from 0.2 to 6 mils, a first thin layer of evaporated P-type doping material applied only to and fused to the flat bottom surface of the depression, a portion of the thickness of the semiconductor material adjacent to the layer at the bottom of the depression being of P-type semiconductively suitable to provide an emitter junction, a second thin layer of evaporated P-type doping material applied to and fused to the lower surface of the wafer over an area larger than and below the layer in the bottom of the depression, a portion of the thickness of the semiconductor material adjacent to the second layer being of P-type semiconductively suitable to provide a collector junction, both the first and second thin layers including an upper layer of readily solderable metal and a superposed transition layer comprising both the doping material and readily solderable material intimately intermixed to provide a gradation from the former to the latter material, and a layer of fused and solidified contact metal applied to the upper surface on the thick periphery of the crystal up to the edge of the depression to provide for a base contact.

12. A transistor comprising a flat single crystal wafer of a solid N-type semiconductor, the crystal wafer being of a thickness of from 8 to 25 mils and having flat parallel upper and lower surfaces, the wafer having a depression with a flat bottom surface disposed in the upper surface, the walls of the depression rising substantially vertically from the flat bottom to the upper surface, thereby providing a relatively thick periphery entirely surrounding the depression, the distance from the bottom surface of the depression to the lower surface being from 0.2 to 6 mils, a first thin layer of evaporated P-type doping material applied only to and fused to the flat bottom surface of the depression, a portion of the thickness of the semiconductor material adjacent to the layer at the bottom of the depression being of P-type semiconductivity suitable to provide an emitter junction, a second thin layer of evaporated aluminum applied to and fused to the lower surface of the single crystal over an area larger than and below the layer in the bottom of the depression, a portion of the thickness of the semiconductor material adjacent to the second layer being of P-type semiconductively suitable to provide a collector junction, a thin transition layer of an intimate intermixture of a readily solderable metal and the doping material applied to and bonded to both the first layer and the second layer, and a layer of the readily solderable metal applied to and bonded to the transition layers to enable electrical leads to be soldered thereto, and a layer of fused and solidified contact metal applied to the upper surface on the thick periphery of the crystal up to the edge of the depression to provide for a base contact.

13. A semiconductor tetrode comprising an elongated flat single crystal wafer of a solid N-type semiconductor, the wafer being of a thickness of from 8 to 25 mils and having flat parallel upper and lower surfaces, the wafer having a depression with a flat bottom surface disposed in the upper surface, the walls of the depression rising substantially vertically from the flat bottom to the upper surface, thereby providing a relatively thick periphery entirely surrounding the groove, the groove being elongated, the distance from the bottom surface of the groove to the lower surface of the crystal being from 0.2 to 6 mills, a first thin layer of evaporated aluminum applied only to and fused to the bottom surface of the depression, a portion of the thickness of the semiconductor material adjacent to the layer at the bottom of the depression being of P-type semiconductively suitable to provide an emitter junction, a second thin layer of evaporated aluminum applied to and fused to the lower surface of the wafer over an area larger than and below the layer in the bottom of the depression, a portion of the thickness of the semiconductor material adjacent to the second layer being of P-type semiconductively suitable to provide a collector junction, a thin transition layer of an intimate intermixture of aluminum and a readily solderable metal applied to and bonded to each of the first and second thin layers of aluminum, and a layer of the readily solderable metal alone applied to and bonded to the transition layer to enable electrical leads to be soldered thereto, and two separate layers of fused and solidified contact metal applied symmetrically to the upper surface only on the sides of the thick periphery of the crystal parallel to the length of the groove, to provide for separate base junctions, the two separate layers not extending beyond a vertical plane at each end of the first thin layer.

14. The tetrode of claim 13, wherein the P-type doping material is aluminum, and each of the thin layers comprise an area of lesser extent and contained well within each of the P-type junction areas, the areas of lesser extent including the transition layer comprising jointly evaporated aluminum and silver as the readily solderable metal and the superposed layer of the readily solderable metal alone comprises silver.

15. A power transistor comprising a flat single crystal wafer of a solid N-type semiconductor, the wafer being of a thickness of from 8 to 25 mils and having flat parallel upper and lower surfaces, the wafer having a plurality of parallel elongated grooves of a width not exceeding 150 mils and with flat bottom surfaces disposed in the upper surface, the walls of each groove rising substantially vertically from the periphery of the groove to the upper surface, the wall thickness of the wafer between adjacent grooves being at least 10 mils, the distance from the bottom surface to the lower surface of the crystal being from 0.2 to 6 mils, a first thin layer of P-type doping material evaporated only on and fused to the flat bottom surface of each groove, a portion of the thickness of the semiconductor material adjacent to the first thin layer of doping material being of P-type semiconductivity suitable to provide an emitter junction, a second thin layer of P-type doping material evaporated on and fused to the lower surface of the wafer over an area including the projection of the bottoms of all of the grooves thereon and whose periphery extends substantially beyond such projection of the bottoms of all of the grooves on the lower surface, a thin transition layer of an intimate intermixture of a readily solderable metal and the doping material applied to and bonded to both the first layer and the second layer, and a layer of the readily solderable metal applied to and bonded to the transition layers to enable electrical leads to be soldered thereto, a portion of the thickness of the semiconductor material adjacent the second layer being of P-type semiconductivity suitable to provide a collector junction, the whole forming a P–N–P transistor, and a layer comprising fused and solidified contact metal applied to the upper surface up to the edge of each groove to provide for a base contact.

16. The power transistor of claim 15, wherein the P-type doping material is aluminum.

17. The power transistor of claim 15, wherein the layer of fused and solidified contact metal is applied only to the portions of the upper surface parallel to the grooves and not extending beyond the vertical plane at which the adjacent first layers end.

References Cited in the file of this patent

UNITED STATES PATENTS

| | | |
|---|---|---|
| 2,561,411 | Pfann | July 24, 1951 |
| 2,705,767 | Hall | Apr. 5, 1955 |
| 2,802,159 | Stump | Aug. 6, 1957 |
| 2,829,992 | Gudmundsen et al. | Apr. 8, 1958 |
| 2,834,701 | Gudmundsen et al. | May 13, 1958 |
| 2,837,704 | Emeis | June 3, 1958 |
| 2,845,374 | Jones | July 29, 1958 |
| 2,846,626 | Nowak | Aug. 5, 1958 |
| 2,854,366 | Wannlund et al. | Sept. 30, 1958 |
| 2,879,188 | Strull | Mar. 24, 1959 |
| 2,885,609 | Williams et al. | May 5, 1959 |

OTHER REFERENCES

RCA Review, December 1953, vol. XIV, No. 4, pages 589–594.